United States Patent [19]

Agostino et al.

[11] Patent Number: 5,215,861

[45] Date of Patent: Jun. 1, 1993

[54] THERMOGRAPHIC REVERSIBLE PHOTORESIST

[75] Inventors: Peter A. Agostino, Canaan; Adolph Herbst, Peekskill, both of N.Y.; Frederick M. Pressman, Norwalk, Conn.

[73] Assignee: International Business Machines Corporation, Armonk, N.Y.

[21] Appl. No.: 852,864

[22] Filed: Mar. 17, 1992

[51] Int. Cl.$^5$ .............................. G03C 1/492
[52] U.S. Cl. .................... 430/270; 525/480; 525/506; 528/25; 528/29; 522/166
[58] Field of Search ............... 430/270; 525/480, 506; 528/29, 25; 522/166

[56] References Cited

U.S. PATENT DOCUMENTS

| | | | |
|---|---|---|---|
| 2,182,208 | 12/1939 | Nason | 524/313 |
| 2,413,582 | 12/1946 | Rust et al. | 556/478 |
| 2,707,191 | 4/1955 | Martin et al. | 525/480 |
| 2,920,058 | 1/1960 | Brown | 525/507 |
| 3,398,122 | 8/1968 | Shepard et al. | 525/480 |
| 3,481,901 | 12/1969 | Prochaska | 525/480 |
| 3,911,169 | 10/1975 | Lesaicherre et al. | 427/96 |
| 4,045,397 | 8/1977 | Parkinson | 524/262 |
| 4,237,259 | 12/1980 | Keeley | 528/204 |
| 4,238,375 | 12/1980 | Blount | 525/446 |
| 4,451,969 | 6/1984 | Chaudhuri | 427/74 |
| 4,565,846 | 1/1986 | Saito et al. | 525/101 |
| 4,599,243 | 7/1986 | Sachdev et al. | 427/38 |
| 4,631,322 | 12/1986 | Isayama et al. | 525/480 |
| 4,692,398 | 12/1987 | Durham | 430/329 |
| 4,751,170 | 6/1988 | Mimura et al. | 430/296 |
| 4,770,974 | 9/1988 | Hiraoka | 430/270 |
| 4,782,008 | 11/1988 | Babich et al. | 430/313 |
| 4,806,458 | 2/1989 | Durham | 430/331 |

OTHER PUBLICATIONS

Y. Saotome et al. J. Electro Chem Soc, vol. 132(4) p. 909 Apr. 1985.

M. Toriumi et al., Alkali-Developable Silicon Containing Positive Photoresist(ASTRO) for a Two-Layer Resist System, J. Electrochem Soc., vol. 134, No. 4, Apr. 1987, pp. 936-939.

F. Coopmans et al., DESIRE: A New Route to Submicron Optical Lithography, Solid State Technology, Jun. 1987, pp. 93-98.

F. Watanabe et al., Oxygen reactive ion etching of organosilicon polymers, J. Vac. Sci. Technol. B 4 (1), Jan./Feb. 1986, pp. 422-425.

C. W. Wilkins, Jr. et al., An organosilicon novalac resin for multilevel resist applications, J. Vac. Sci. Technol., Jan./Feb. 1985, pp. 306-309.

Primary Examiner—Marion E. McCamish
Assistant Examiner—Janis L. Dote
Attorney, Agent, or Firm—Whitham & Marhoefer

[57] ABSTRACT

Reaction products of organosilane compounds and a novolac resin having phenolic groups are capable of generating either positive or negative tone patterns depending on the time and temperature of processing. Particular photosensitive materials contemplated have the following chemical formula:

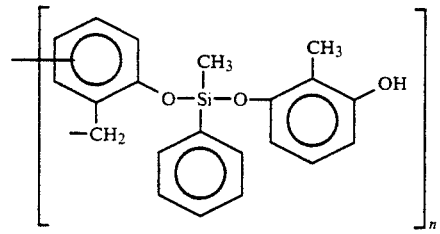

3 Claims, 1 Drawing Sheet

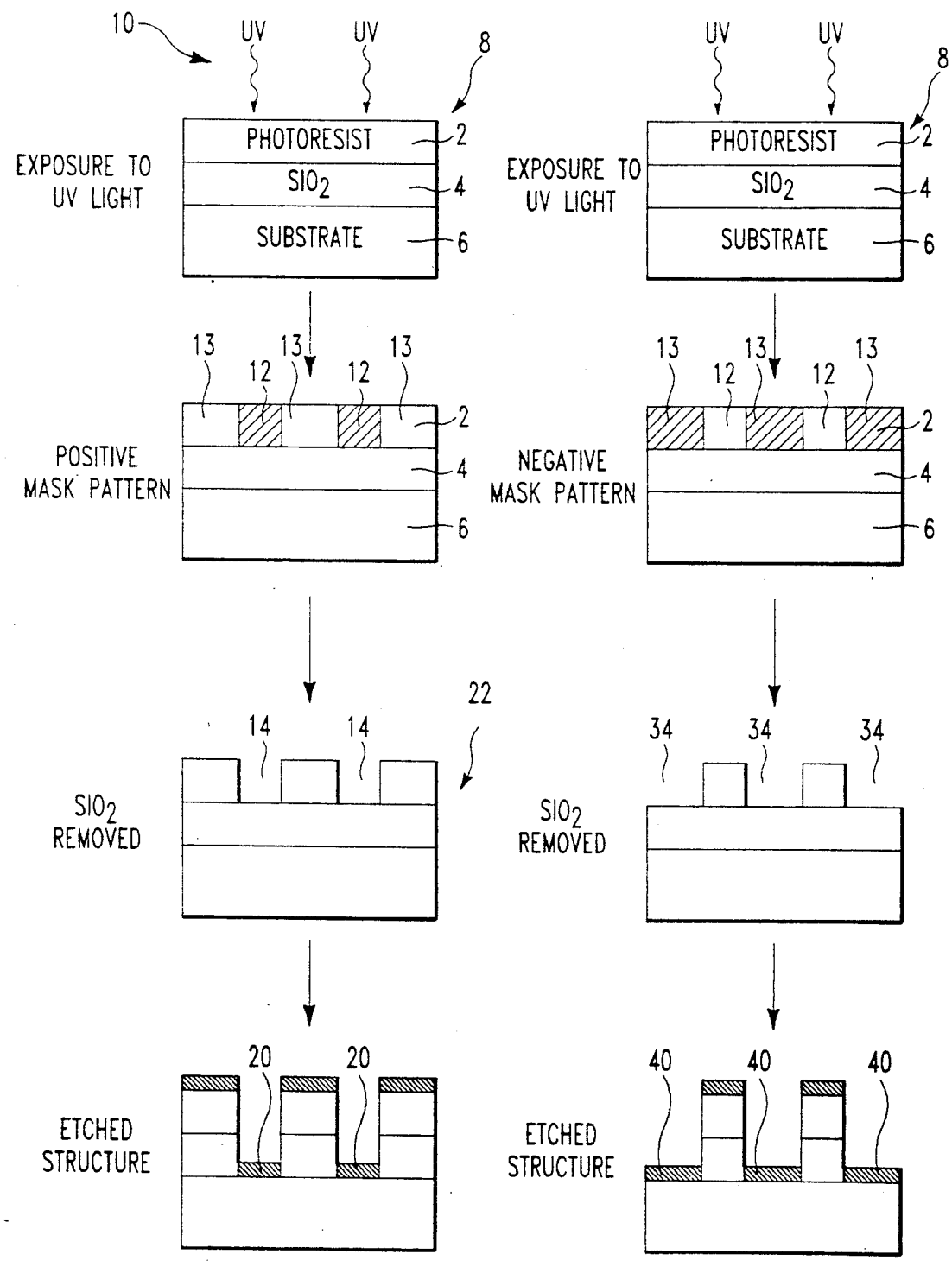

THERMOGRAPHIC REVERSIBLE PHOTORESIST

BACKGROUND OF THE INVENTION

1. Field of the Invention

The present invention is generally related to a photoresist for semiconductor processing and, more particularly, to a photoresist material which generates a positive or negative tone pattern depending upon the developing time and bake temperature.

2. Description of the Prior Art

A wide variety of wafer patterning techniques are currently in use in the semiconductor industry. Generally, patterning is a function of the resist chemistry, the patterning equipment, and the wafers themselves. It is well-known in the semiconductor art to vary the patterning by using either a positive or negative photoresist. Typically, a silicon crystal is placed in a diffusion furnace containing an atmosphere of oxygen. The surface of the silicon oxidizes to form a silicon dioxide ($SiO_2$) overlay, which resists diffusion and, therefore, can be used to form a mask. The $SiO_2$ is then coated with a photoresist and photographic etching processes are used to make the mask. The nature of the photoresist used to coat the $SiO_2$ overlay determines the areas which are etched. The basis for all photoresists is a photolytic reaction in the film which changes the solubility of the exposed material. However, positive resists are completely different chemical systems from negative resists. Positive resists become soluble when exposed to UV radiation, leaving a protective film after the exposed portions of the film are dissolved. These resists preserve the tone of the mask and form a positive image of the mask. Conversely, in negative resists the exposed material becomes less soluble than the unexposed material. The wafer areas exposed to UV radiation are protected, thereby reversing the tone of the mask and yielding a negative image.

SUMMARY OF THE INVENTION

It is therefore an object of the present invention to provide a photosensitive material that may be used to formulate a photoresist material that is easily converted from a positive tone pattern to a negative tone pattern by changing the temperature and bake times.

According to the invention, a photoresist is synthesized by the reaction of 2-methylresorcinol and the reaction product of a novolac resin and a silane. The photoresist is coated on wafers and patterned by standard lithographic techniques. Baking the wafers for a short time at a temperature Conversely, baking the wafers for an extended period of time at about 150° C. results in a negative tone pattern.

BRIEF DESCRIPTION OF THE DRAWINGS

The foregoing and other objects, aspects and advantages will be better understood from the following detailed description of the preferred embodiments of the invention with reference to the drawings, in which:

FIG. 1 are sequential cross-sectional side views of a substrate being patterned to form a positive tone pattern;

FIG. 2 are sequential cross-sectional side views of a substrate being patterned to form a negative tone pattern.

DETAILED DESCRIPTION OF A PREFERRED EMBODIMENT OF THE INVENTION

The above and various other objects and advantages of the invention are achieved by a photoresist material which is a reaction product of 2-methylresorcinol and a reaction product of a novolak resin having phenolic groups and an organosilane compound having the formula:

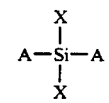

wherein A is selected from a group consisting of methyl and phenyl groups and wherein X is a halogen, said photoresist material being capable of generating positive and negative tone patterns depending on a time and temperature of heating.

A photosensitive material which can selectively form a positive or negative tone pattern depending upon the duration of heat exposure, herein defined as a "thermographic reversible photoresist", is synthesized by reacting 2-methylresorcinol and the reaction product of a novolac and silane. Novolacs define a well-known group of phenol-formaldehyde polymers and are commercially available from a variety of sources including Hoechst Celanese and Aldrich. The silane compound used in the production of a photosensitive material within the scope of the present invention was methylphenyldichlorosilane; however, similar silanes are considered within the scope of the present invention. A particular photosensitive compound within the present invention was made according to the following reaction scheme:

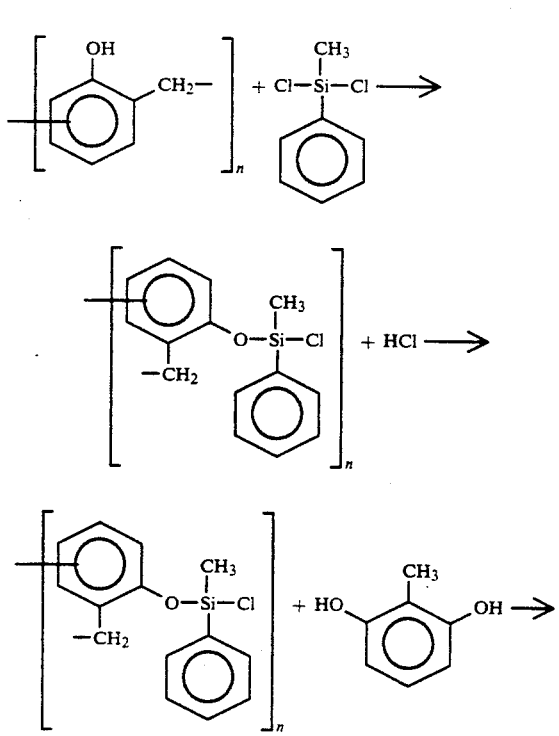

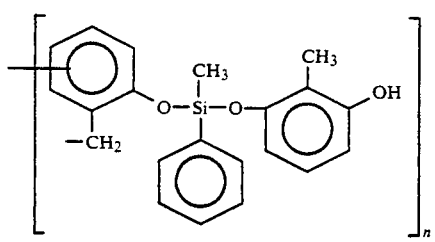

In the synthesis of the photosensitive material, 19.1 grams of methylphenyldichlorosilane was mixed with 20 ml of n-butylacetate in a 3-neck flask fitted with a thermometer condenser, magnetic stirrer and addition flask. Methylphenyldichlorosilane is commercially available from Petrarch. The solution was heated to a reflux temperature of 126° C., and a solution of 80 ml n-butylacetate and 10.6 grams of Alnovol PN430, a novolac resin, having the formula:

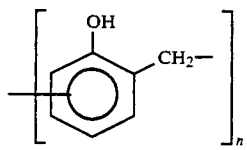

was added dropwise at the rate of 0.2 drops/sec while the solution was stirred. Alnovol PN430 is commercially available from Hoechst Celanese. The reaction was carried out under a nitrogen blanket to prevent moisture from reacting with the dichlorosilane. The combined solution was refluxed until the evolution of HCl gas by-product ceased which occurred after approximately 72 hours. HCl gas is the reaction product of the two compounds where Cl acts as a leaving group on the silane and the H leaves the hydroxyl on the phenol. The reaction endpoint is achieved when no more HCl gas is produced. 12.4 grams of 2-methylresorcinol was then added to the solution and allowed to react with the remaining chloro group of the silane. The resulting resin material is a photosensitive polymer having n=40 to 80 repeat units. It should be understood that the resin material could be made by other methods on an industrial scale.

In a test experiment, the resin solution was cooled and filtered through a Buchner funnel with diatomaceous earth. 10 grams of the solution was separated out and mixed with 0.15 grams of a photoactive compound. Upon complete dissolution of the photoactive compound, the resulting photoresist was clear and clean of particulates. The photoresist was spun onto two sets of wafers to a thickness of 2 microns and baked at 85° C. for ½ hour to drive off the bulk of n-butyl acetate solvent. The wafers were then exposed to a standard mercury light and patterned using standard lithographic techniques.

The first set of wafers was then baked for 90 seconds at 150° C. and developed in either a standard developer solution for 20-30 minutes or in EMT 130, a solvent based developer, for 10 minutes. EMT 130 is commercially available from Shipley Co. The exposed portions of photoresist were removed upon developing and the treatment process resulted in a positive tone pattern.

The second set of wafers was baked for 30 minutes at 150° C. and developed in the same manner as above. The unexposed portions of photoresist were removed upon developing and the treatment process resulted in a negative tone pattern.

FIG. 1 shows a process of using the photoresist made in accordance with the present invention to make a positive tone pattern. A substrate 6 having a $SiO_2$ overlay 4 is overcoated with the photoresist 2 synthesized by the reaction of 2-methylresorcinol and the reaction product of a novolac resin and silane, as described above. The resulting structure 8 is baked and then patterned by imaging with Ultraviolet (UV) light 10. The resulting structure is then baked at 145° to 155° C. for 90 seconds. Because of the relatively short heat treatment, the exposed areas 12 of the photoresist 2 become more soluble than the unexposed areas 13, thus leaving a positive mask pattern 14 upon developing. It was noted that if this short heating step was omitted, a very rough surface film resulted on RIE etching. When the photoresist patterned structure 22 is etched, the $SiO_2$ is removed from the unexposed patterned areas 20, which are unprotected by photoresist.

FIG. 2 shows a process of using the photoresist to make a negative tone pattern. The photoresist 2 is coated on the $SiO_2$ layer 4 and imaged as in the method described above. The resulting structure 8 is then baked at 145° to 155° C. for 30 minutes. Under these conditions the exposed areas 32 become less soluble than the unexposed areas 33 leaving a negative mask pattern 34 upon developing. A standard etching process is then used to remove the $SiO_2$ from the patterned areas 40.

An advantage of the present invention is the ability to selectively form positive and negative areas of patterning on a single wafer. Still another advantage is the minimal process costs associated with changing from a positive to a negative photoresist or a combination thereof during wafer patterning.

While the invention has been described in terms of a single preferred embodiment where the reaction product of a particular novolac, silane and 2-methylresorcinol is used to create a thermographic reversible photoresist, those skilled in the art will recognize that the invention can be practiced with modification within the spirit and scope of the appended claims.

Having thus described our invention, what we claim as new and desire to secure by Letters Patent is as follows:

1. A photoresist material which is a reaction product of 2-methylresorcinol and a reaction product of a novolac resin having phenolic groups and an organosilane compound having the formula:

wherein A is selected from a group consisting of methyl and phenyl groups and wherein X is a halogen, said photoresist material being capable of generating positive and negative tone patterns depending on a time and temperature of heating.

2. A photoresist material as recited in claim 1 having the formula:

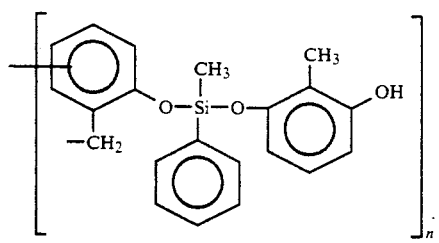
wherein n is greater than 1.
3. A photoresist material as recited in claim 2 wherein n is in a range of 40 to 80.
* * * * *
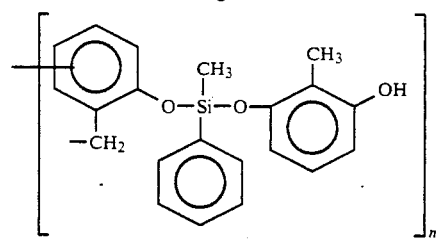
wherein n is greater than 1.
3. A photoresist material as recited in claim 2 wherein n is in a range of 40 to 80.
* * * * *

UNITED STATES PATENT AND TRADEMARK OFFICE
CERTIFICATE OF CORRECTION

PATENT NO. : 5,215,861

DATED : June 1, 1993

INVENTOR(S) : Peter A. Agostino, Adolph Herbst, Frederick M. Pressman

It is certified that error appears in the above-identified patent and that said Letters Patent is hereby corrected as shown below:

In Column 1, line 53, after "at a temperature" insert:

-- of about 150°C results in a positive tone pattern. --

In Column 6, delete all matter in column 6, which erroneously reiterates column 5.

Signed and Sealed this

Twentieth Day of September, 1994

Attest:

BRUCE LEHMAN

Attesting Officer

Commissioner of Patents and Trademarks